US012684855B2

(12) United States Patent
Wang

(10) Patent No.: US 12,684,855 B2
(45) Date of Patent: Jul. 14, 2026

(54) SEMICONDUCTOR STRUCTURE COMPRISING AIR SPACER ON SIDEWALLS OF GATE ELECTRODE LAYER AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 819 days.

(21) Appl. No.: 17/953,864

(22) Filed: Sep. 27, 2022

(65) Prior Publication Data
US 2023/0093835 A1 Mar. 30, 2023

(30) Foreign Application Priority Data
Sep. 30, 2021 (CN) .......................... 202111161524.5

(51) Int. Cl.
*H10D 64/66* (2025.01)
*H10D 30/01* (2025.01)
(Continued)

(52) U.S. Cl.
CPC ......... *H10D 64/679* (2025.01); *H10D 30/024* (2025.01); *H10D 30/6211* (2025.01);
(Continued)

(58) Field of Classification Search
CPC .............. H10D 64/679; H10D 30/024; H10D 30/6211; H10D 64/015; H10D 64/017;
(Continued)

(56) References Cited

U.S. PATENT DOCUMENTS

2011/0309416 A1* 12/2011 Yamashita ........... H10D 30/601
257/E21.409
2018/0350938 A1* 12/2018 Lee ................... H01L 21/28088
(Continued)

FOREIGN PATENT DOCUMENTS

CN 109427653 A 3/2019
CN 113363210 A * 9/2021 ......... H10D 84/0149

*Primary Examiner* — Brad A Knudson
(74) *Attorney, Agent, or Firm* — Anova Law Group, PLLC

(57) ABSTRACT

A semiconductor structure and its fabrication method are provided. The semiconductor structure includes: a substrate including a base substrate, fins, and an isolation structure; a first dielectric layer; gate structures in the first dielectric layer, where each gate structure includes a gate electrode layer and a gate dielectric layer; air spacers and second spacers on sidewalls of gate electrode layers, where the air spacers are located between the gate electrode layers and the second spacers to expose the sidewalls of the gate electrode layers and the second spacers; source/drain layers in the fins at sides of each gate structure; first conductive structures in the first dielectric layer and on the source/drain layers; and a second dielectric layer on the first dielectric layer and the gate structures, located on the air spacers. The air spacers are also located between the first conductive structures and the gate electrode layers.

17 Claims, 7 Drawing Sheets

(51) Int. Cl.

| | |
|---|---|
| *H10D 30/62* | (2025.01) |
| *H10D 64/01* | (2025.01) |
| *H10D 84/01* | (2025.01) |
| *H10D 84/03* | (2025.01) |
| *H10D 84/83* | (2025.01) |
| *H10D 62/13* | (2025.01) |

(52) U.S. Cl.
　　CPC ......... *H10D 64/015* (2025.01); *H10D 64/017* (2025.01); *H10D 64/021* (2025.01); *H10D 84/0147* (2025.01); *H10D 84/0158* (2025.01); *H10D 84/038* (2025.01); *H10D 84/834* (2025.01); *H10D 62/151* (2025.01); *H10D 84/013* (2025.01); *H10D 84/0151* (2025.01)

(58) Field of Classification Search
　　CPC ............. H10D 64/021; H10D 84/0147; H10D 84/0158; H10D 84/038; H10D 84/834; H10D 62/151; H10D 84/013; H10D 84/0151
　　See application file for complete search history.

(56) References Cited

U.S. PATENT DOCUMENTS

| | | | | |
|---|---|---|---|---|
| 2019/0006484 A1* | 1/2019 | Wu | .................... | H01L 21/32139 |
| 2020/0335337 A1* | 10/2020 | Chiang | .............. | H01L 21/0337 |
| 2020/0403094 A1* | 12/2020 | You | .................. | H01L 21/76897 |
| 2023/0253246 A1* | 8/2023 | Cheng | .............. | H01L 21/76832 |
| | | | | 257/288 |

* cited by examiner

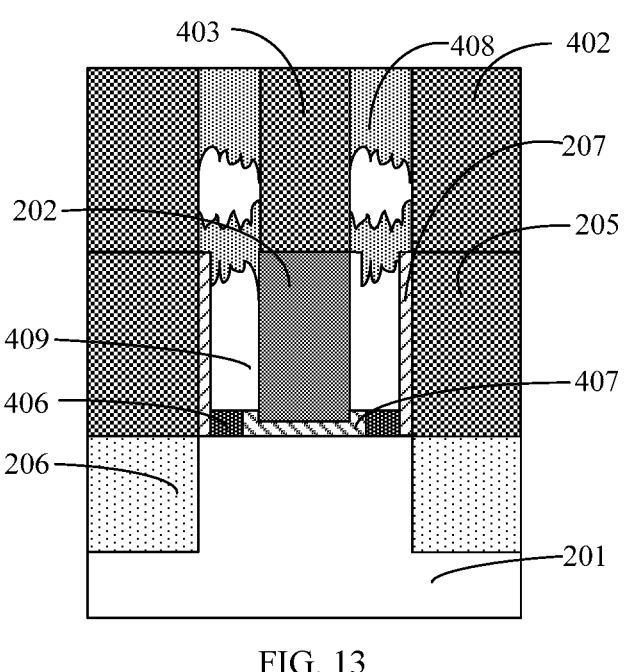

FIG. 13

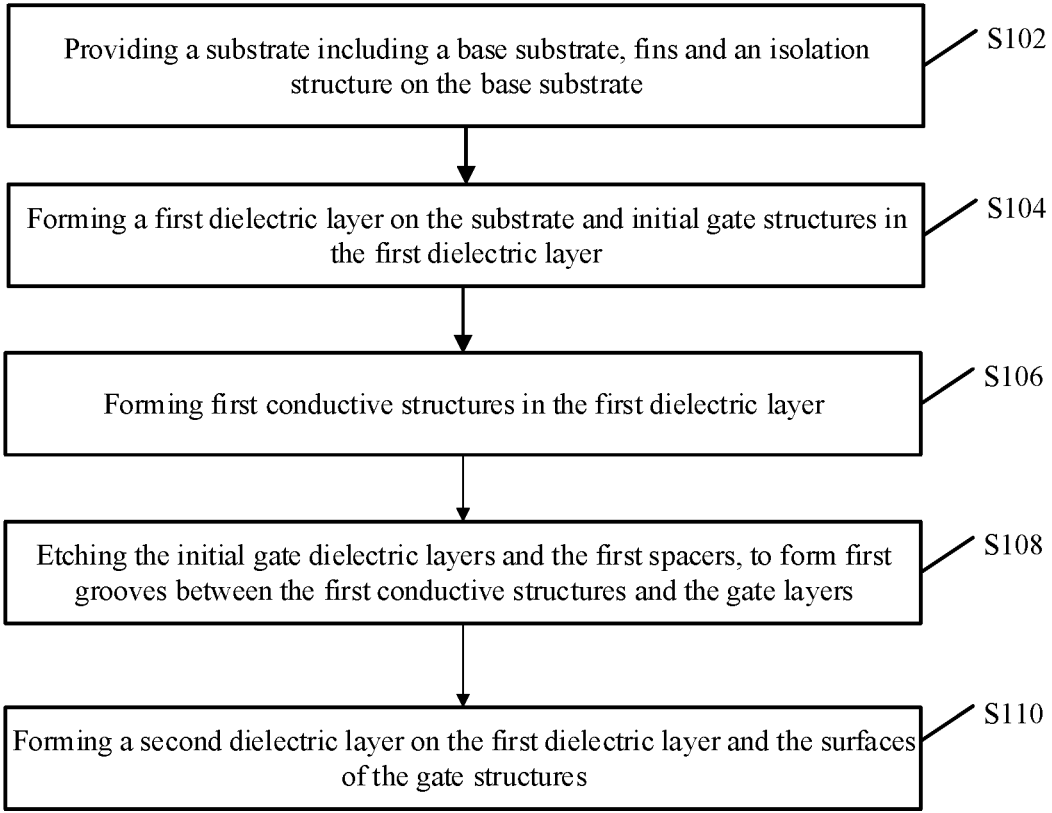

Providing a substrate including a base substrate, fins and an isolation structure on the base substrate — S102

Forming a first dielectric layer on the substrate and initial gate structures in the first dielectric layer — S104

Forming first conductive structures in the first dielectric layer — S106

Etching the initial gate dielectric layers and the first spacers, to form first grooves between the first conductive structures and the gate layers — S108

Forming a second dielectric layer on the first dielectric layer and the surfaces of the gate structures — S110

FIG. 14

SEMICONDUCTOR STRUCTURE COMPRISING AIR SPACER ON SIDEWALLS OF GATE ELECTRODE LAYER AND FABRICATION METHOD THEREOF

CROSS-REFERENCE TO RELATED APPLICATION

This application claims the priority of Chinese Patent Application No. 202111161524.5, filed on Sep. 30, 2021, the content of which is incorporated herein by reference in its entirety.

TECHNICAL FIELD

The present disclosure generally relates to the field of semiconductor fabrication technology and, more particularly, relates to a semiconductor structure and its fabrication method.

BACKGROUND

With the continuous development of semiconductor technologies, improvement of performance of integrated circuits is mainly achieved by continuously reducing sizes of integrated circuit devices to increase their speed. Currently, the semiconductor industry has progressed to a nanotechnology process node because of demands of high device density, high performance, and low cost, and fabrication of semiconductor devices is limited by various physical limits.

With the evolution of semiconductor technology process nodes, the increase in the device density has brought many problems, one of which is the rapidly increasing parasitic capacitance between a metal gate and a contact hole. Excessive parasitic capacitance can significantly affect the dynamic performance of the device. Currently, a low dielectric constant dielectric layer, including silicon oxide or silicon nitride, is usually used as a spacer between the metal gate and the contact hole to eliminate this effect.

However, the problem of excessive parasitic capacitance of semiconductor devices still needs to be improved.

SUMMARY

One aspect of the present disclosure provides a semiconductor structure. The semiconductor structure includes: a substrate including a base substrate, fins, and an isolation structure on the base substrate, where the isolation structure is also located on sidewalls of the fins and has a top surface lower than top surfaces of the fins; a first dielectric layer on the substrate and gate structures in the first dielectric layer, where: the gate structures cross the fins and are located on a portion of sidewalls and top surfaces of the fins; each gate structure includes a gate electrode layer and a gate dielectric layer at a bottom of the gate electrode layer, air spacers and second spacers on sidewalls of gate electrode layers, where the air spacers are located between the gate electrode layers and the second spacers and expose the sidewalls of the gate electrode layers and the second spacers; source/drain layers in the fins at two sides of each gate structure; first conductive structures in the first dielectric layer, where the first conductive structures are located on surfaces of the source/drain layers; and a second dielectric layer on surfaces of the first dielectric layer and the gate structures, where the second dielectric layer is located on tops of the air spacers and the air spacers are also located between the first conductive structures and the gate electrode layers.

Optionally, the gate dielectric layer includes a portion of an initial gate dielectric layer on sidewalls of the gate electrode layer.

Optionally, the semiconductor structure further includes second conductive structures on surfaces of the first conductive structure and third conductive structures on the surfaces of the gate electrode layers, where the air spacers are also located between the second conductive structures and the third conductive structures.

Another aspect of the present disclosure provides a fabrication method for forming a semiconductor structure. The method includes: providing a substrate including a base substrate, fins, and an isolation structure on the base substrate, where the isolation structure is also located on sidewalls of the fins and has a top surface lower than top surfaces of the fins; forming a first dielectric layer on the substrate and initial gate structures in the first dielectric layer, where; the initial gate structures cross the fins and are located on a portion of sidewalls and top surfaces of the fins; each initial gate structure includes a gate electrode layer and an initial gate dielectric layer on sidewalls and a bottom of the gate electrode layer; first spacers and second spacers are provided between sidewalls of the initial gate structures and the first dielectric layer; the first spacers are located between sidewalls of initial gate dielectric layers and the second spacers; forming first conductive structures in the first dielectric layer, where the first conductive structures are located on the surface of the substrate at two sides of each initial gate structure; etching the initial gate dielectric layers and the first spacers, to form first grooves between the first conductive structures and the gate electrode layers, where the first grooves expose the sidewalls of the gate electrode layers, a portion of the initial gate dielectric layers is used to form gate dielectric layers, and gate structures are formed from the initial gate structures; and forming a second dielectric layer on the first dielectric layer and the surfaces of the gate structures, where the second dielectric layer seals tops of the first grooves to form air spacers between the first conductive structures and the gate electrode layers.

Optionally, the gate dielectric layers also include a portion of the initial gate dielectric layers on the sidewalls of the gate electrode layers.

Optionally, the first grooves are formed by: etching the first spacers to a target depth such that a remaining portion of the first spacers forms protective layers; and etching the initial gate dielectric layers after forming the protective layers.

Optionally, the method further includes forming source/drain layers in the substrate at two sides of each gate structure, where the first conductive structures are located on surfaces of the source/drain layers.

Optionally, the first conductive structures, the initial gate structures, and the source/drain layers are formed by: before forming the first dielectric layer, forming dummy gate structures, the first spacers and the second spacers, on a portion of the substrate, where the first spacers and the second spacers are located on sidewalls of the dummy gate structures; the first spacers are located between the dummy gate structures and the second spacers; the dummy gate structures cross the fins and are located on a portion of sidewalls and top surfaces of the fins; forming the source/drain layers in the fins at two sides of each dummy gate structure; after forming the source/drain layers, forming the first dielectric layer on the substrate, where the first dielectric layer is located on the sidewalls of the dummy gate structures and exposes the top surfaces of the dummy gate structures; removing the dummy gate structures to form gate openings in the first dielectric layer; forming the initial gate dielectric layers and the gate electrode layers on the initial gate dielectric layers in the gate openings; forming first openings in the first dielectric layer, to expose a part of the surfaces of the source/drain layers; and forming the first conductive structures in the first openings.

Optionally, before forming the first grooves, the method further includes: forming a third dielectric layer on the first dielectric layer, the initial gate structures, and the surfaces of the first conductive structures; and forming second grooves in the third dielectric layer, to expose the top surfaces of the initial gate dielectric layers and the first spacers.

Optionally, the third dielectric layer is made of a material including silicon oxide, silicon nitride, silicon oxynitride, silicon oxycarbide, silicon carbonitride, silicon oxycarbonitride, or a combination thereof.

Optionally, before forming the first grooves, the method further includes: forming a third dielectric layer on the surfaces of the first dielectric layer, the initial gate structure, and the first conductive structures; forming second conductive structures in the third dielectric layer, where the second conductive structures are located on the surfaces of the first conductive structures; forming third conductive structures in the third dielectric layer, where the third conductive structures are located on the surfaces of the gate electrode layers; removing the third dielectric layer to form second grooves exposing the top surfaces of the initial gate dielectric layers and the first spacers.

Optionally, the air spacers are also located between second conductive structures and the third conductive structures.

Optionally, the third dielectric layer is made of silicon oxide, silicon nitride, silicon oxynitride, silicon oxycarbide, silicon carbonitride, silicon oxycarbonitride, or a combination thereof.

Optionally, the first spacers and the second spacers are made of different materials.

Optionally, the second spacers are made of silicon oxide, silicon nitride, silicon oxynitride, silicon oxycarbide, silicon carbonitride, silicon oxycarbonitride or a combination thereof; and the first spacers are made of silicon oxide, silicon nitride, silicon oxynitride, silicon oxycarbide, silicon carbonitride, silicon oxycarbonitride or a combination thereof.

Optionally, the gate dielectric layers are made of a high-K dielectric material and the gate electrode layers are made of metal.

Optionally, the second dielectric layer is formed by a plasma-enhanced chemical vapor deposition process.

Optionally, the second dielectric layer is made of silicon oxide, silicon nitride, silicon oxynitride, silicon oxycarbide, silicon carbonitride, silicon oxycarbonitride, or a combination thereof.

Optionally, a depth-to-width ratio of the first grooves is about 2:1 to about 10:1.

In the fabrication method of the semiconductor structure provided by various embodiments of the present disclosure, the initial gate dielectric layers and the first spacers may be etched to form the first grooves between the first conductive structures and the gate electrode layers. The first grooves may expose the sidewalls of the gate electrode layers. A portion of the initial gate dielectric layers at the bottoms of the gate electrode layers may be used to form the gate dielectric layers, and another portion of the initial gate dielectric layers on the sidewalls of the gate electrode layers may be removed. The parasitic capacitance between the gate electrode layers and the first conductive structures may be reduced. Further, the second dielectric layer may be formed on the surface of the first dielectric layer and the gate structures. The second dielectric layer may enclose the tops of the first grooves, to form the air spacers between the first conductive structures and the gate electrode layers. The air spacers may have a small dielectric constant and may be used for isolating the gate electrode layers and the first conductive structures. Correspondingly, the parasitic capacitance between the gate electrode layers and the first conductive structures may be reduced, therefore improving the performance of the device.

Further, the first spacers may be etched to the target depth, and the remaining portion of the first spacers may form the protective layers. The protective layers may protect the subsequently formed gate dielectric layers from being damaged in the etching process. The gate leakage current and the performance of the device may be improved.

Further, the first spacers and the second spacers may be made of different materials, and the second spacers may be used to prevent the first dielectric layer from being damaged by etching during the etching process. The performance stability of the formed device may be improved.

In the semiconductor structure provided by various embodiments of the present disclosure, each gate structure may include the gate electrode layer and the gate dielectric layer at the bottom of the gate electrode layer. There may be no gate dielectric layers on the sidewalls of the gate electrode layers of the semiconductor structure. The air spacers may be located between the first conductive structures and the gate electrode layers. The air spacers may have a small dielectric constant and may be used for isolating the gate electrode layers and the first conductive structures. Correspondingly, the parasitic capacitance between the gate electrode layers and the first conductive structures may be reduced, therefore improving the performance of the device.

BRIEF DESCRIPTION OF THE DRAWINGS

The following drawings are merely examples for illustrative purposes according to various disclosed embodiments and are not intended to limit the scope of the present disclosure.

FIGS. 9-13 illustrate semiconductor structures corresponding to certain stages of forming another exemplary semiconductor structure according to various disclosed embodiments of the present disclosure; and FIG. 14 illustrates an exemplary method for forming a semiconductor structure according to various disclosed embodiments of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It should be noted that "surface" or "upper" in this specification are used to describe the relative positional relationship in space, and are not limited to whether they are in direct contact.

Figure 1:
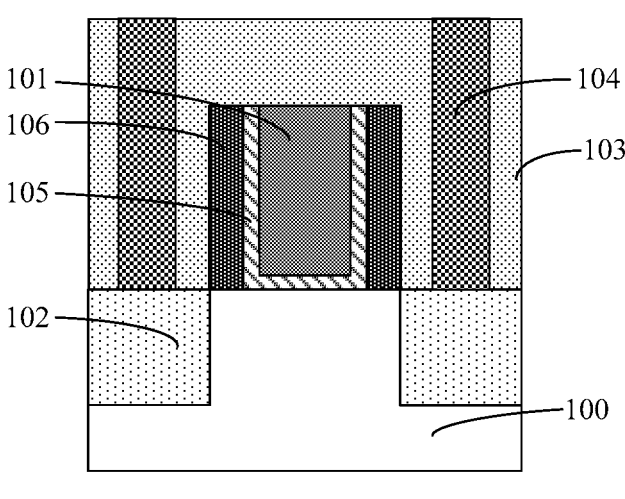
FIG. 1 illustrates a cross-section view of a semiconductor structure.

FIG. 1 illustrates a cross-section view of a semiconductor structure.

As shown in FIG. 1, the semiconductor structure includes: a substrate 100, gate structures on a portion of the substrate 100; source/drain regions 102 in the substrate 100 at two sides of each gate structure; a dielectric layer 103 on the substrate 100; and conducting plugs 104 in the dielectric layer 103. Each gate structure includes a gate electrode layer 101. The dielectric layer 103 is located on top surfaces and sidewalls of the gate structures. The conducting plugs 104 are located on the source/drain regions 102.

In the semiconductor structure, the gate electrode layers 101 are made of metal, and are formed by using a metal replacement gate process. Gate dielectric layers 105 made of a high-K dielectric material are provided between the gate electrode layers 101 and the substrate 100, and are used to improve leakage currents of the gate structures and improve reliability of the formed device. With the development of integrated circuits, a feature size of the semiconductor structure is getting smaller and smaller, and distances between the conductive plugs 104 and the gate structures are also getting smaller and smaller, and the parasitic capacitance between the conductive plug 104 and the gate structure becomes larger and larger correspondingly. The gate structures further include spacers 106 on the sidewalls of the gate electrode layers 101. To reduce the parasitic capacitance, the spacers 106 are usually made of a low-K dielectric material to reduce the influence of the parasitic capacitance.

However, because of limitation of the metal replacement gate process, the gate dielectric layers 105 are also be formed on the sidewalls of the gate electrode layers 101. Since the gate dielectric layers 105 are made of a high-K dielectric material, the gate dielectric layers 105 will induce increase of the parasitic capacitance, therefore affecting the performance of the semiconductor structure. In another example, air spacers are used to replace the spacers. The air spacers have a smaller dielectric constant, to reduce the influence of the parasitic capacitance. However, since the gate structures are formed by the metal replacement gate process, the gate dielectric layers are inevitably introduced on the sidewalls of the gate electrode layers, and the existence of the gate dielectric layers limits further reduction of the parasitic capacitance.

The present disclosure provides a semiconductor structure and its fabrication method. An initial gate dielectric layer and first spacers may be etched to form first grooves between first conductive structures and gate electrode layers. The first grooves may expose sidewalls of the gate electrode layers. A portion of the initial gate dielectric layer at bottoms of the gate electrode layers may be used to form a gate dielectric layer, and another portion of the initial gate dielectric layer on the sidewalls of the gate electrode layers may be removed. The parasitic capacitance between the gate electrode layers and the first conductive structures may be reduced. Further, a second dielectric layer may be formed on a surface of the first dielectric layer and the gate structures. The second dielectric layer may enclose the tops of the first grooves, to form air spacers between the first conductive structures and the gate electrode layers. The air spacers may have a small dielectric constant and may be used for isolating the gate electrode layers and the first conductive structures. Correspondingly, the parasitic capacitance between the gate electrode layers and the first conductive structures may be reduced, therefore improving the performance of the device.

Figure 2:
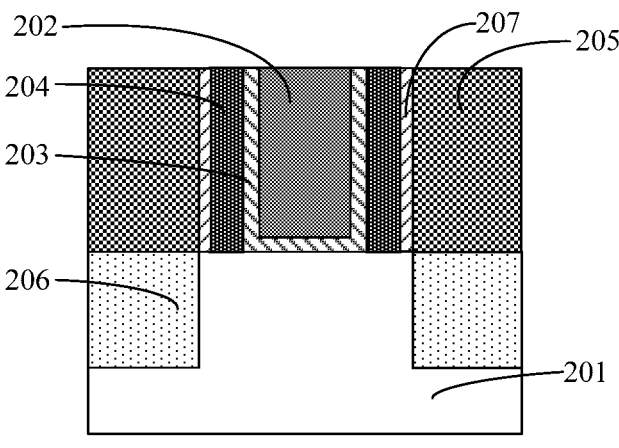
FIGS. 2-4 illustrate semiconductor structures corresponding to certain stages of forming an exemplary semiconductor structure according to various disclosed embodiments of the present disclosure.
Figure 3:
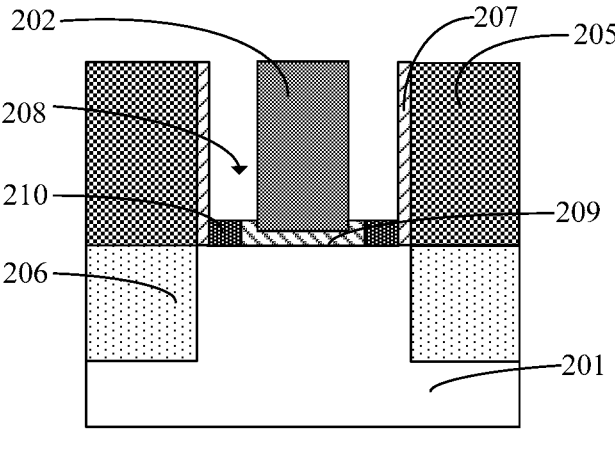
Figure 4:
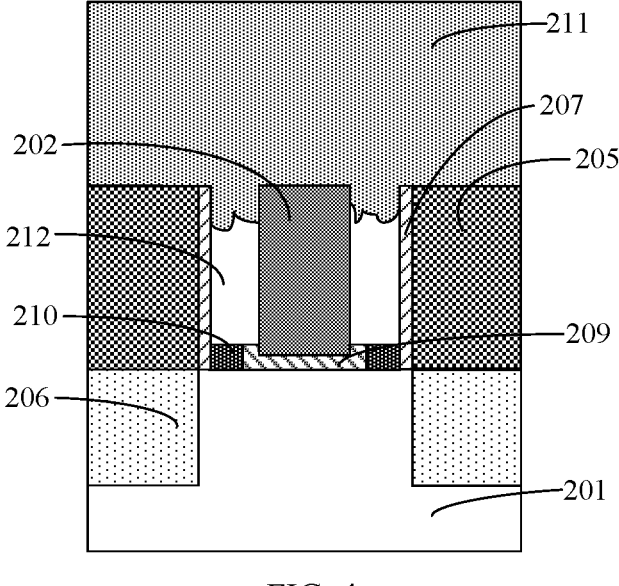

FIGS. 2-4 illustrate semiconductor structures corresponding to certain stages of forming an exemplary semiconductor structure according to various disclosed embodiments of the present disclosure, and FIG. 14 illustrates an exemplary fabrication method of a semiconductor structure.

As shown in FIG. 2, a substrate 201 may be provided (e.g., S102 in FIG. 14). The substrate 201 may include a base substrate (not shown in the figure), fins (not shown in the figure) on the base substrate, and an isolation structure (not shown in the figure). The isolation structure may be also located on sidewalls of the fins, and may have a top surface lower than top surfaces of the fins.

In one embodiment, the base substrate may be made of a material including silicon.

In other embodiments, the base substrate may be made of a material including SiC, SiGe, a multi-nary semiconductor material made of III-V elements, silicon-on-insulator (SOI), germanium-on-insulator (GOI), or a combination thereof. The multi-nary semiconductor material made of III-V elements may include InP, GaAs, GaP, InAs, InSb, InGaAs, or InGaAsP.

In one embodiment, the fins may be made of a material including silicon. In other embodiments, the fins may be made of a material including silicon, SiGe, or a combination thereof.

Subsequently, a first dielectric layer and initial gate structures in the first dielectric layer may be formed on the substrate (e.g., S104 in FIG. 14). The initial gate structures may cross the fins and located on a part of sidewalls and top surfaces of the fins. Each initial gate structure may include a gate electrode layer, and an initial gate dielectric layer on sidewall surfaces and a bottom of the gate electrode layer. First spacers and second spacers may be formed between sidewalls of the initial gate structures and the first dielectric layer. The first spacers may be located between the sidewalls of the initial gate dielectric layers and the second spacers. First conductive structures may be formed in the first dielectric layer. The first conductive structures may be located on the substrate at two sides of each initial gate structure.

Specifically, the first conductive structures may be located on the source/drain layers in the substrate at two sides of each initial gate structure. The formation method of the first conductive structures, the initial gate structures and the source/drain layers are shown in FIG. 2 and FIG. 3.

As shown in FIG. 2, before forming the first dielectric layer (not shown in the figure), dummy gate structures (not shown in the figure) may be formed on a portion of the substrate 201, and first spacers 204 and second spacers 207 may be formed on sidewalls of the dummy gate structures. The first spacers 204 may be located between the dummy gate structures and the second spacers 207. The dummy gate structures may cross the fins and located on a part of sidewalls and top surfaces of the fins. Source/drain layers 206 may be formed in the fins at two sides of each dummy gate structures. After forming the source/drain layers 206, a first dielectric layer may be formed on the substrate 201 (not marked in the figure). The first dielectric layer may be located on sidewalls of the dummy gate structures and expose top surfaces of the dummy gate structures. Then the dummy gate structures may be removed to form gate openings (not shown in the figure) in the first dielectric layer. Initial gate dielectric layers 203 and gate electrode layers 202 on surfaces of the initial gate dielectric layers may be formed in the gate openings. First openings (not shown in the figure) may be formed in the first dielectric layer, to expose part of the surfaces of the source/drain layers 206. Then, first conductive structures 205 may be formed in the first openings (e.g., S106 in FIG. 14).

The source/drain layers 206 may be formed by: using the dummy gate structures as a mask to form grooves (not shown in the figure) in the fins at two sides of each dummy gate structure; and forming the source/drain layers 206 in the grooves. Specifically, when forming the grooves, the first spacers 204 and the second spacers 207 may be also used as the mask.

The initial gate dielectric layers 203 may be made of a high-K dielectric material. The high-K dielectric material may have a dielectric constant larger than 3.9, and may be a material including hafnium oxide. In one embodiment, the initial gate dielectric layers 203 may be made of hafnium oxide. The initial gate dielectric layers 203 may be used to form gate dielectric layers.

The gate electrode layers 202 may be made of metal, and the metal may include copper, aluminum, tungsten, or a combination thereof. In one embodiment, the gate electrode layers 202 may be made of tungsten.

The first spacers 204 and the second spacers 207 may be made of different materials. The second spacers 207 may be used to protect the the first conductive structures 205 from etching loss when etching the first spacers 204. In the subsequent process of etching the first spacers 204, an etching process with a larger selection ratio of the first spacers 204 to the second spacers 207 may be used to reduce etching damage on the second spacers 207.

The second spacers 207 may be made of a material including silicon oxide, silicon nitride, silicon oxynitride, silicon oxycarbide, silicon carbonitride, silicon oxycarbonitride or a combination thereof. In one embodiment, the second spacers 207 may be made of silicon nitride.

The first spacers 204 may be made of a material including silicon oxide, silicon nitride, silicon oxynitride, silicon oxycarbide, silicon carbonitride, silicon oxycarbonitride or a combination thereof. In one embodiment, the first spacers 204 may be made of silicon oxide.

The source/drain layers 206 may have doping ions, and the doping ions may be N-type or P-type. The N-type ions may include phosphorus ions, arsenic ions, or antimony ions. The P-type ions may include boron ions, boron fluoride ions or indium ions.

As shown in FIG. 3, the initial gate dielectric layers 203 and the first spacers 204 may be etched to form first grooves 208 between the first conductive structures 205 and the gate electrode layers 202 (e.g., S108 in FIG. 14). The first grooves 208 may expose sidewalls of the gate electrode layers 202, such that gate dielectric layers 209 may be formed from a portion of the initial gate dielectric layers 203 at the bottoms of the gate electrode layers 202, and gate structures may be formed with the initial gate structures.

A depth-to-width ratio of the first grooves 208 may be about 2:1 to about 10:1.

The initial gate dielectric layers 203 may be etched to remove a portion of the initial gate dielectric layers 203 on the sidewalls of the gate electrode layers 202, therefore reducing the parasitic capacitance between the gate electrode layers 202 and the first conductive structures 205.

In one embodiment, the gate dielectric layers 209 may further include a portion of the initial gate dielectric layer located on the sidewalls of the gate electrode layers 202. The first spacers 204 may be etched to form protective layers 210. The protective layers 210 may allow a small amount of the initial gate dielectric layers 203 on the sidewalls of the gate electrode layers 202 to remain, to reduce the occurrence of damage to the gate dielectric layers 209 caused by over-etching and improve the performance of the gate dielectric layers 209.

In one embodiment, the initial gate dielectric layers 203 and the first spacers 204 may be removed by etching in a same process. Specifically, in one embodiment, the material of the initial gate dielectric layer 203 may be hafnium oxide, and the material of the first spacers 204 may be silicon oxide, which may be etched with a hydrofluoric acid solution to form the first grooves 208.

In another embodiment, the first spacers 204 may be etched first, and then the initial gate dielectric layers 203 may be etched.

As shown in FIG. 4, a second dielectric layer 211 may be formed on the surface of the first dielectric layer and the gate structures (e.g., S110 in FIG. 14). The second dielectric layer 211 may close tops of the first grooves 208, to form air spacers 212 between the first conductive structures 205 and the gate electrode layers 202.

In one embodiment, the second dielectric layer 211 may be also located on top surfaces of the second spacers 207 and the first conductive structures 205.

The second dielectric layer 211 may be formed by a plasma-enhanced chemical vapor deposition process.

In one embodiment, process parameters for forming the second dielectric layer 211 may include: a reaction gas of a mixed gas of silane, nitrogen, oxygen and nitrous oxide; a gas flow rate of about 10 standard milliliters per minute to about 30,000 standard milliliters per minute; a pressure of about 0.5 torr to about 20 torr; power of about 100 watts to about 2000 watts. The reaction gas of the deposition process may be preferentially deposited on the tops of the first grooves 208, such that the first grooves 208 may be sealed to form sealed cavities 212.

The second dielectric layer 211 may be made of a material including silicon oxide, silicon nitride, silicon oxynitride, silicon oxycarbide, silicon carbonitride, silicon oxycarbonitride, or a combination thereof.

The air spacers 212 may be formed between the first conductive structures 205 and the gate electrode layers 202, and the air spacers 212 may have a relatively small dielectric constant for isolating the gate electrode layers 202 and the first conductive structures 205. Correspondingly, the parasitic capacitance between the gate electrode layers 202 and the first conductive structures 205 may be reduced, therefore improving the performance of the device.

FIGS. 5-8 illustrate semiconductor structures corresponding to certain stages of forming another exemplary semiconductor structure according to various disclosed embodiments of the present disclosure.

Figure 5:
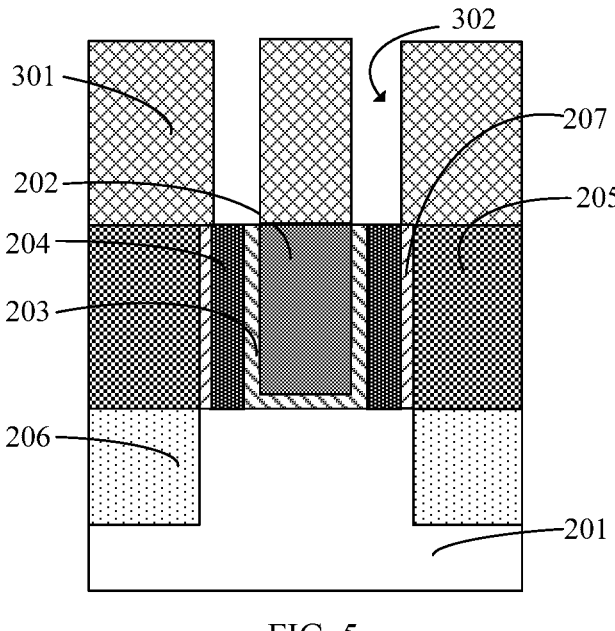
FIGS. 5-8 illustrate semiconductor structures corresponding to certain stages of forming another exemplary semiconductor structure according to various disclosed embodiments of the present disclosure.

As shown in FIG. 5 which is based on FIG. 2, before forming the first grooves, a third dielectric layer 301 may be formed on a surface of the first dielectric layer, the initial gate structures, and the first conductive structures 205. Second grooves 302 may be formed in the third dielectric layer 301, to expose the top surfaces of the initial gate dielectric layers 203 and the first spacers 204.

In one embodiment, the third dielectric layer 301 may be also located on the top surfaces of the first spacers 204 and the second spacers 207.

The third dielectric layer 211 may be made of a material including silicon oxide, silicon nitride, silicon oxynitride, silicon oxycarbide, silicon carbonitride, silicon oxycarbonitride, or a combination thereof.

The second grooves 302 may be used to expose the top surfaces of the initial gate dielectric layers 203 and the first spacers 204, to facilitate subsequent etching of the initial gate dielectric layers 203 and the first spacers 204. Also, the third dielectric layer 301 may protect the gate structures and the surface of the first conductive structures 205 during the etching process.

Subsequently, the initial gate dielectric layers 203 and the first spacers 204 may be etched to form the first grooves between the first conductive structures 205 and the gate electrode layers 202. The first grooves 208 may expose the sidewalls of the gate electrode layers 202, such that gate dielectric layers 209 may be formed from a portion of the initial gate dielectric layers 203 at the bottoms of the gate electrode layers 202.

In one embodiment, the first grooves may be formed by a two-step etching process. That is, the first spacers 204 may be etched before etching the initial gate dielectric layers 203. In other embodiments, the initial gate dielectric layers and the first spacers may be removed by etching in a same process.

Figure 6:
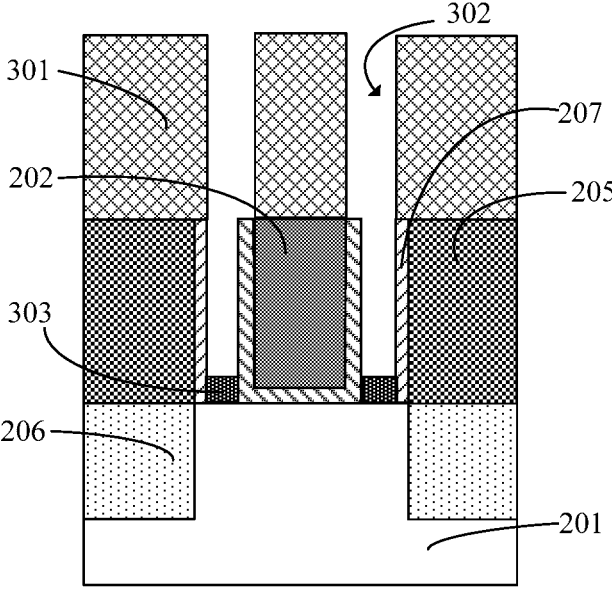
Figure 7:
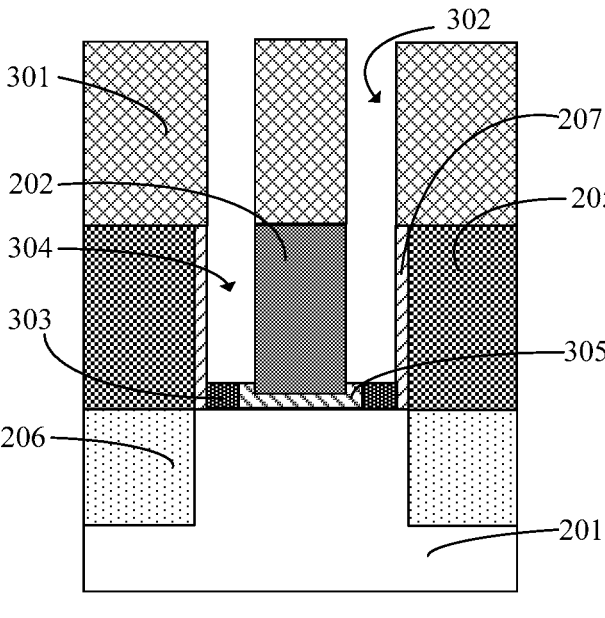

Formation of the first grooves is shown in FIG. 6 and FIG. 7.

As shown in FIG. 6, the first spacers 204 may be etched to a target depth, and a remaining portion of the first spacers 204 may form protective layers 303.

In one embodiment, the first spacers 204 may be made of silicon nitride and the second sidewall spacers 207 may be made of silicon nitride carbide. To avoid the influence of the etching process of the first spacers 204 on the second spacers 207, a process with a larger selection ratio for the first spacers 204 and the second spacers 207 may be selected. In one embodiment, the first spacers 204 may be etched with a phosphoric acid solution.

The protective layers 303 may be used to protect the subsequently formed gate dielectric layers from damage during the etching process, which may be beneficial to improve the gate leakage current of the formed device and the performance of the device.

As shown in FIG. 7, after forming the protective layers 303, the initial gate dielectric layers 203 may be etched.

In one embodiment, the initial gate dielectric layer 203 may be made of hafnium oxide, and may be etched with a hydrofluoric acid solution.

The initial gate dielectric layers 203 and the first spacers 204 may be etched to form first grooves 304 between the first conductive structures 205 and the gate electrode layers 202. The first groove 304 may expose the sidewalls of the gate electrode layers 202. A portion of the initial gate dielectric layers 203 at the bottoms of the gate electrode layers 202 may be used to form the gate dielectric layers, and gate structures may be formed from the initial gate structures.

The first grooves 304 may be subsequently used to form air spacers.

The initial gate dielectric layers 203 may be etched to remove the initial gate dielectric layers 203 on the sidewalls of the gate electrode layers 202, therefore reducing the parasitic capacitance between the gate electrode layers 202 and the first conductive structures 205.

Figure 8:
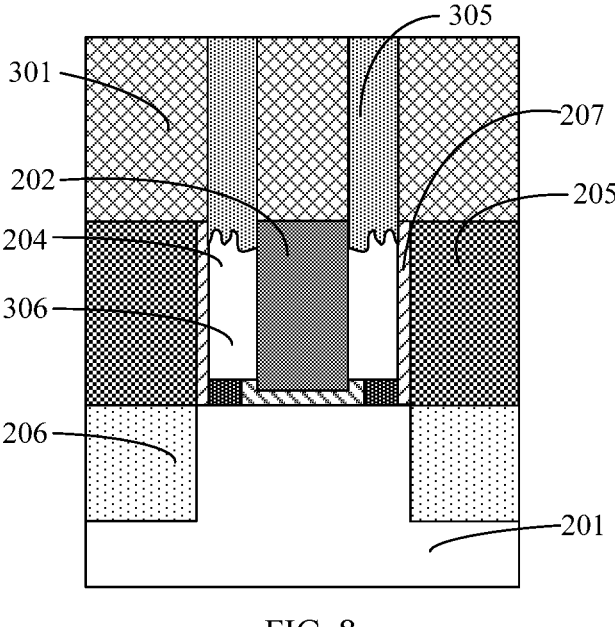

As shown in FIG. 8, a second dielectric layer 305 may be formed on the surface of the first dielectric layer and the gate structures. The second dielectric layer 305 may seal the tops of the first grooves 304, to form air spacers 306 between the first conductive structures 205 and the gate electrode layers 202.

In one embodiment, the second dielectric layer 305 may be also located in the second grooves 302.

The second dielectric layer 305 may be made of a material including silicon oxide, silicon nitride, silicon oxynitride, silicon oxycarbide, silicon carbonitride, silicon oxycarbonitride, or a combination thereof.

The air spacers 306 may be formed between the first conductive structures 205 and the gate electrode layers 202, and the air spacers 306 may have a relatively small dielectric constant for isolating the gate electrode layers 202 and the first conductive structures 205. Correspondingly, the parasitic capacitance between the gate electrode layers 202 and the first conductive structures 205 may be reduced, therefore improving the performance of the device.

FIGS. 9-13 illustrate semiconductor structures corresponding to certain stages of forming another exemplary semiconductor structure according to various disclosed embodiments of the present disclosure.

Figure 9:
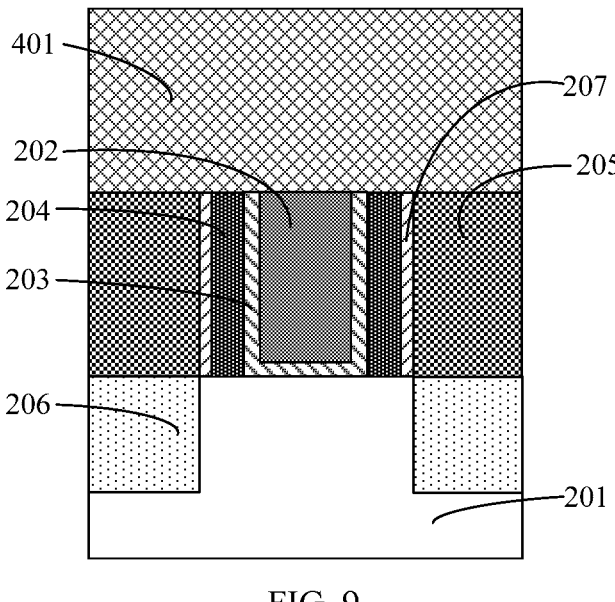

As shown in FIG. 9 which is based on FIG. 2, before forming the first grooves, a third dielectric layer 401 may be formed on the surface of the first dielectric layer, the initial gate structures, and the first conductive structures 205.

In one embodiment, the third dielectric layer 401 may be also located on the top surfaces of the first spacers 204 and the second spacers 207.

The third dielectric layer 401 may be made of a material including silicon oxide, silicon nitride, silicon oxynitride, silicon oxycarbide, silicon carbonitride, silicon oxycarbonitride, or a combination thereof.

Figures 10, 11:
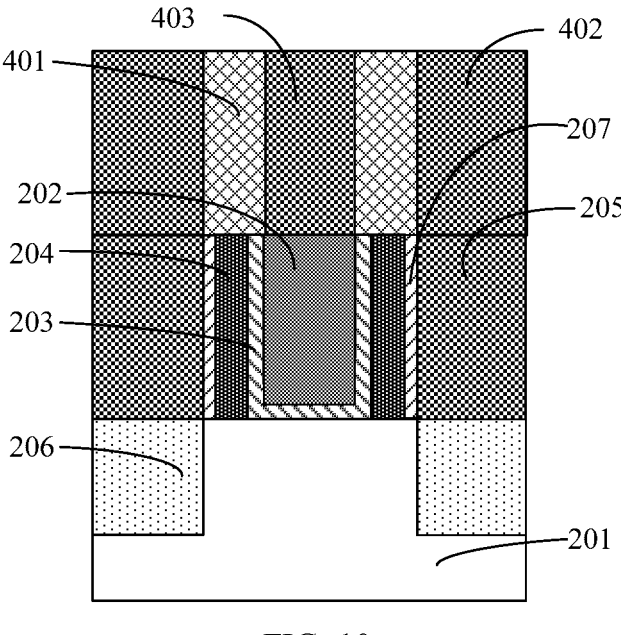

As shown in FIG. 10, second conductive structures 402 may be formed in the third dielectric layer 401. The second conductive structures 402 may be located on the surfaces of the first conductive structures 205. Third conductive structure 403 may be formed in the third dielectric layer 401. The third conductive structure 403 may be located on the surfaces of the gate electrode layers 202.

As shown in FIG. 11, the third dielectric layer 401 may be removed to form second grooves 404. The second grooves 404 may expose top surfaces of the initial gate dielectric layers 203 and the first spacers 204.

The second grooves 404 may expose the top surfaces of the initial gate dielectric layers 203 and the first spacers 204, to prepare for subsequent etching of the initial gate dielectric layers 203 and the first spacers 204.

Figure 12:
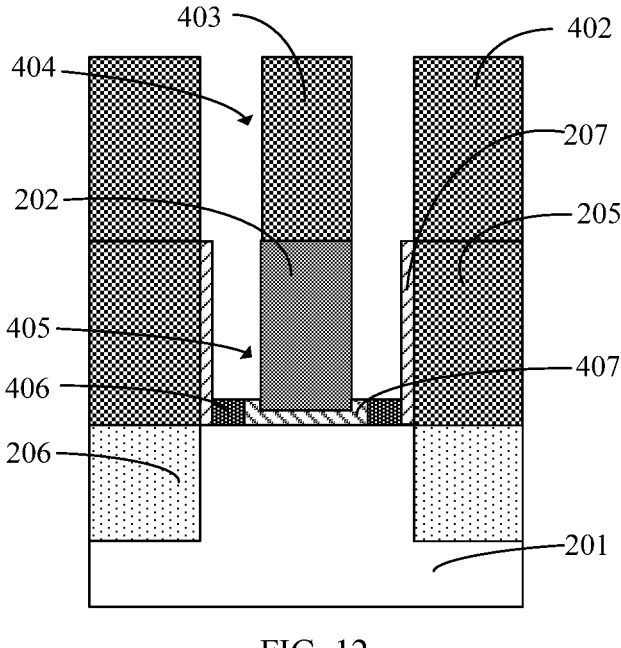

As shown in FIG. 12, the initial gate dielectric layers 203 and the first spacers 204 may be etched to form first grooves 405 between the first conductive structures 205 and the gate electrode layers 202, and form protective layers 406 after the etching of the first spacers 204. The first groove 405 may expose the sidewalls of the gate electrode layers 202. Gate dielectric layers 407 may be formed from a portion of the initial gate dielectric layers 203 at the bottoms of the gate electrode layers 202, and gate structures may be formed from the initial gate structures.

A depth-to-width ratio of the first grooves 208 may be about 2:1 to about 10:1.

In one embodiment, the initial gate dielectric layers 203 and the first spacers 204 may be removed by etching in a same process. Specifically, in one embodiment, the material of the initial gate dielectric layer 203 may be hafnium oxide, and the material of the first spacers 204 may be silicon oxide, which may be etched with a hydrofluoric acid solution to form the first grooves 208.

In another embodiment, the first spacers 204 may be etched first, and then the initial gate dielectric layers 203 may be etched.

As shown in FIG. 13, a second dielectric layer 408 may be formed on the surface of the first dielectric layer and the gate structures. The second dielectric layer 408 may seal tops of the first grooves 405, to form air spacers 409 between the first conductive structures 205 and the gate electrode layers 202.

In one embodiment, the second dielectric layer 408 may be also located in the second grooves 404.

In one embodiment, the second dielectric layer 408 may be also located between the second conductive structures 402 and the third conductive structures 403.

Correspondingly, the air spacers 409 may be formed between the first conductive structures 205 and the gate electrode layers 202, and the air spacers 409 may have a relatively small dielectric constant for isolating the gate electrode layers 202 and the first conductive structures 205. Correspondingly, the parasitic capacitance between the gate electrode layers 202 and the first conductive structures 205 may be reduced, therefore improving the performance of the device.

The present disclosure also provides a semiconductor structure. In one embodiment shown in FIG. 13, the semiconductor structure may include: a substrate 201, a first dielectric layer and gate structures on the substrate 201, air spacers 409 and second spacers 207, source/drain layers 206, first conductive structures in the first dielectric layer, a second dielectric layer 408 on surfaces of the first dielectric layer and the gate structures. The substrate 201 may include a base substrate (not shown in the figure), fins (not shown in the figure) on the base substrate, and an isolation structure (not shown in the figure). The isolation structure may be also located on sidewalls of the fins, and may have a top surface lower than top surfaces of the fins. The gate structures may cross the fins and located in a part of sidewalls and top surfaces of the fins. Each gate structure may include a gate electrode layer 202 and a gate dielectric layer 407 at a bottom of the gate electrode layer 202. The air spacers 409 and the second spacers 207 may be disposed on the sidewalls of the gate electrode layers 202. The air spacers 409 may be located between the gate electrode layer 202 and the second spacer 207, and may expose the sidewalls of the gate electrode layers 202 and the second spacers 207. The first conductive structures 205 may be located on the surfaces of the source/drain layers 206. The second dielectric layer 408 may be located on tops of the air spacer 409, and the air spacers 409 may be also located between the first conductive structures 205 and the gate electrode layers 202.

Each gate structure may include the gate electrode layer 202 and the gate dielectric layer 407 located at the bottom of the gate electrode layer 202. There may be no gate dielectric layers on the sidewalls of the gate electrode layers 202 of the semiconductor structure, therefore reducing the parasitic capacitance between the first conductive structures 205 and the gate electrode layers 202. Also, the air spacer 409 may have a relatively small dielectric constant for isolating the gate electrode layers 202 and the first conductive structures 205. Correspondingly, the parasitic capacitance between the gate electrode layers 202 and the first conductive structures 205 may be reduced, therefore improving the performance of the device.

In one embodiment, the gate dielectric layers 407 may further include a portion of initial gate dielectric layers located on the sidewalls of the gate electrode layers 202. In another embodiment, there may be no initial gate dielectric layers on the sidewalls of the gate electrode layers 202. There may be no gate dielectric layers or only a small amount of the initial gate dielectric layers may remain on the sidewalls of the gate electrode layers 202 of the semiconductor structure, therefore reducing the parasitic capacitance between the gate electrode layers and the first conductive structures.

In one embodiment, the semiconductor structure may further include second conductive structures 402 located on the surfaces of the first conductive structures 205 and third conductive structures 403 located on the surfaces of the gate electrode layers 202. The air spacers 409 may be also located between the second conductive structures 402 and the third conductive structures 403.

In the fabrication method of the semiconductor structure provided by various embodiments of the present disclosure, the initial gate dielectric layers and the first spacers may be etched to form the first grooves between the first conductive structures and the gate electrode layers. The first grooves may expose the sidewalls of the gate electrode layers. A portion of the initial gate dielectric layers at bottoms of the gate electrode layers may be used to form the gate dielectric layers, and another portion of the initial gate dielectric layers on the sidewalls of the gate electrode layers may be removed. The parasitic capacitance between the gate electrode layers and the first conductive structures may be reduced. Further, the second dielectric layer may be formed on the surface of the first dielectric layer and the gate structures. The second dielectric layer may enclose the tops of the first grooves, to form the air spacers between the first conductive structures and the gate electrode layers. The air spacers may have a small dielectric constant and may be used for isolating the gate electrode layers and the first conductive structures. Correspondingly, the parasitic capacitance between the gate electrode layers and the first conductive structures may be reduced, therefore improving the performance of the device.

Further, the first spacers may be etched to the target depth, and the remaining portion of the first spacers may form the protective layers. The protective layers may protect the subsequently formed gate dielectric layers from being damaged in the etching process. The gate leakage current and the performance of the device may be improved.

Further, the first spacers and the second spacers may be made of different materials, and the second spacers may be used to prevent the first dielectric layer from being damaged by etching during the etching process. The performance stability of the formed device may be improved.

In the semiconductor structure provided by various embodiments of the present disclosure, each gate structure may include the gate electrode layer and the gate dielectric layer at the bottom of the gate electrode layer. There may be no gate dielectric layers on the sidewalls of the gate electrode layers of the semiconductor structure. The air spacers may be located between the first conductive structures and the gate electrode layers. The air spacers may have a small dielectric constant and may be used for isolating the gate electrode layers and the first conductive structures. Correspondingly, the parasitic capacitance between the gate electrode layers and the first conductive structures may be reduced, therefore improving the performance of the device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A semiconductor structure, comprising:
   a substrate;

a gate structure over the substrate, wherein the gate structure includes a gate electrode layer and a gate dielectric layer under the gate electrode layer, on each side of the gate electrode layer, a protective layer is sandwiched between a sidewall spacer and the gate dielectric layer along a lateral direction;

a first air spacer, over each of the protective layer and a portion of the gate dielectric layer and between the sidewall spacer and the gate electrode layer, wherein the sidewall spacer, the protective layer, and the gate dielectric layer are made of different materials, and tops of the protective layer and the gate dielectric layer are coplanar with each other;

a source layer and a drain layer, in the substrate and on each side of the gate structure; and a first conductive structure over each of the source layer and the drain layer, wherein the sidewall spacer is formed on a sidewall of the first conductive structure.

2. The semiconductor structure according to claim 1, wherein:

the gate dielectric layer includes a portion on a lower portion of sidewalls of the gate electrode layer.

3. The semiconductor structure according to claim 1, wherein:

bottoms of the sidewall spacer, the protective layer, and the gate dielectric layer are coplanar with each other over the substrate.

4. The semiconductor structure according to claim 1, wherein:

the first conductive structure is formed on an entire surface of each of the source layer and the drain layer.

5. The semiconductor structure according to claim 1, further comprising:

a second conductive structure over the first conductive structure, a third conductive structure over the gate electrode layer, a dielectric layer above the sidewall spacer and the first air spacer on each side of the gate electrode layer, and a second air spacer contained in the dielectric layer, and between the second and third conductive structures on each side of the gate electrode layer.

6. The semiconductor structure according to claim 5, wherein:

the second conductive structure is formed over an entire surface of the first conductive structure, and the third conductive structure is formed over an entire surface of the gate electrode layer.

7. The semiconductor structure according to claim 1, wherein:

the protective layer is made of a material including silicon oxide, silicon nitride, silicon oxynitride, silicon oxycarbide, silicon carbonitride, silicon oxycarbonitride, or a combination thereof.

8. The semiconductor structure according to claim 1, wherein:

the gate dielectric layer is made of a high-K dielectric material.

9. The semiconductor structure according to claim 1, wherein:

a depth-to-width ratio of the first air spacer is about 2:1 to about 10:1.

10. A fabrication method of a semiconductor structure, comprising:

providing a substrate;

forming a gate structure over the substrate, wherein the gate structure includes a gate electrode layer and a gate dielectric layer under the gate electrode layer, on each side of the gate electrode layer, forming a protective layer that is sandwiched between a sidewall spacer and the gate dielectric layer along a lateral direction, wherein a first air spacer is formed over each of the protective layer and a portion of the gate dielectric layer and between the sidewall spacer and the gate electrode layer, and the sidewall spacer, the protective layer, and the gate dielectric layer are made of different materials, and wherein tops of the protective layer and the gate dielectric layer are coplanar with each other;

forming a source layer and a drain layer in the substrate and on each side of the gate structure; and forming a first conductive structure over each of the source layer and the drain layer, wherein the sidewall spacer is formed on a sidewall of the first conductive structure.

11. The fabrication method according to claim 10, wherein:

bottoms of the sidewall spacer, the protective layer, and the gate dielectric layer are coplanar with each other over the substrate.

12. The fabrication method according to claim 10, wherein:

the first conductive structure is formed on an entire surface of each of the source layer and the drain layer.

13. The fabrication method according to claim 10, further comprising:

forming a second conductive structure over the first conductive structure, forming a third conductive structure over the gate electrode layer, forming a dielectric layer above the sidewall spacer and the first air spacer on each side of the gate electrode layer, wherein a second air spacer contained in the dielectric layer, and between the second and third conductive structures on each side of the gate electrode layer.

14. The fabrication method according to claim 13, wherein:

the second conductive structure is formed over an entire surface of the first conductive structure, and the third conductive structure is formed over an entire surface of the gate electrode layer.

15. The fabrication method according to claim 10, wherein:

the protective layer is made of a material including silicon oxide, silicon nitride, silicon oxynitride, silicon oxycarbide, silicon carbonitride, silicon oxycarbonitride, or a combination thereof.

16. The fabrication method according to claim 10, wherein:

the gate dielectric layer is made of a high-K dielectric material.

17. The fabrication method according to claim 10, wherein:

a depth-to-width ratio of the first air spacer is about 2:1 to about 10:1.

* * * * *